United States Patent [19]

Bui

[11] Patent Number: 5,726,458
[45] Date of Patent: Mar. 10, 1998

[54] HOT CARRIER INJECTION TEST STRUCTURE AND TECHNIQUE FOR STATISTICAL EVALUATION

[75] Inventor: Nguyen Duc Bui, San Jose, Calif.

[73] Assignee: Advanced Micro Devices, Inc., Sunnyvale, Calif.

[21] Appl. No.: 807,931

[22] Filed: Feb. 28, 1997

Related U.S. Application Data

[63] Continuation of Ser. No. 613,782, Feb. 29, 1996, abandoned, which is a continuation of Ser. No. 340,138, Nov. 15, 1994, abandoned.

[51] Int. Cl.$^6$ .................................................. H01L 27/10
[52] U.S. Cl. ........................... 257/48; 257/204; 257/211; 257/365; 257/401
[58] Field of Search .......................... 257/401, 211, 257/202, 208, 210, 206, 413, 365, 366, 48, 205, 204

[56] References Cited

U.S. PATENT DOCUMENTS

| 3,652,906 | 3/1972 | Christensen | 257/401 X |
| 4,631,571 | 12/1986 | Tsubokura | 357/68 |
| 4,939,690 | 7/1990 | Momodomi et al. | 257/205 X |
| 5,350,710 | 9/1994 | Hong et al. | 437/170 |

FOREIGN PATENT DOCUMENTS

| 0076006 | 9/1982 | European Pat. Off. | H01L 29/60 |
| 0166112 | 4/1985 | European Pat. Off. | H01L 23/48 |
| 58-223373 | 12/1983 | Japan | 257/365 |
| 63-150966 | 6/1988 | Japan | 257/401 |
| 5021729 | 1/1993 | Japan | 257/401 |

*Primary Examiner*—William Mintel
*Attorney, Agent, or Firm*—Sawyer & Associates

[57] ABSTRACT

An improved transistor design and methods of construction and testing for same. The novel transistor design method includes the steps of providing a transistor with multiple common gate areas; connecting each gate area to a pad; and adjusting the ratio of the area of the pad to the total of the gate areas to provide a predetermined ratio. The ratio may be adjusted by adjusting the size of the gate, in a single gate implementation, or adjusting the number of gates in a multiple gate configuration. The novel transistor includes a substrate; at least one source disposed on the substrate; at least one drain disposed on the substrate; and at least one gate disposed on the substrate between the source and the drain. The gate has a first layer of at least partially conductive material of area $A_g$ connected to a pad of area $A_p$. In accordance with the present teachings, the antenna ratio R of the area of the pad $A_p$ to the area of the gate $A_g$ is a predetermined number. In practice, the ratio R would be chosen to be a minimum so that deleterious plasma currents attracted to the gate area would be reduced. In a particular implementation, the transistor includes plural gates each having a layer of at least partially conductive material of area $A_{gn}$ where n is any integer between 1 and N and where N is the total number of gates. In this case, the plural gates are interconnected and the ratio R is a predetermined number equal to $A_p/A_{gtotal}$, where $A_{gtotal}$ is the sum of the areas $A_{gn}$ and n is any integer between 1 and N. The novel method for testing multiple gate transistors includes the steps of connecting a first terminal of each of said transistors to a ground; interconnecting a second terminal of each transistor and applying a first source of supply potential; and selectively applying a second source of supply potential to a third terminal of a selected transistor.

9 Claims, 6 Drawing Sheets

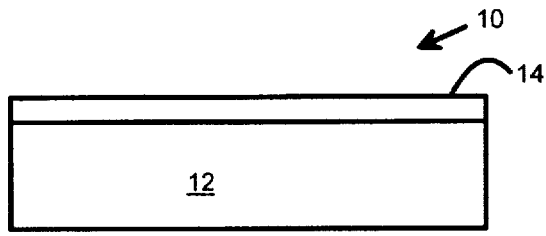
PRIOR ART FIGURE 1
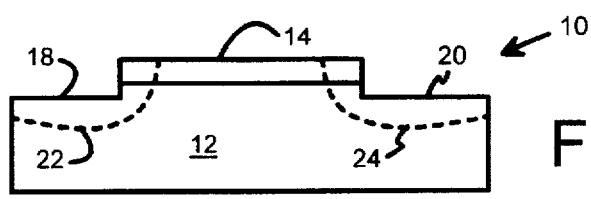
PRIOR ART FIGURE 2
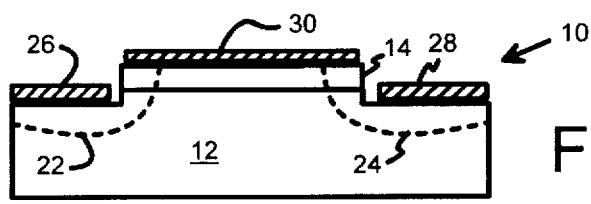
PRIOR ART FIGURE 3
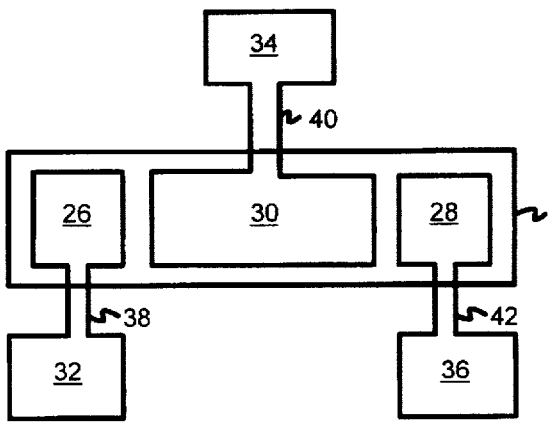
PRIOR ART FIGURE 4

HOT CARRIER INJECTION TEST STRUCTURE AND TECHNIQUE FOR STATISTICAL EVALUATION

This application is a continuation of application Ser. No. 8/613,782 filed on Feb. 29, 1996, now abandoned, which is a continuation of Ser. No. 08/340,138 filed on Nov. 15, 1994, and now abandoned.

BACKGROUND OF THE INVENTION

1. Field of the Invention

The present invention relates to transistor design, construction and fabrication. More specifically, the present invention relates to the design of complementary metal-oxide semiconductor (CMOS) transistors for optimal hot carrier injection testing of same.

2. Description of the Related Art

CMOS transistors are widely used in applications requiring high-speed, low power digital circuits including microprocessors, memory devices and gate arrays. CMOS transistors are typically fabricated by bonding silicon dioxide layers on a silicon substrate. The silicon dioxide layers are selectively etched away with a plasma current to expose the silicon substrate. Exposed silicon on either side of a nonetched area is implanted with ions to create source and drain areas. A conductive layer is deposited on the nonexposed area to create a gate for the transistor. Additional conductive layers are disposed on the source and drain areas to provide electrical connection thereto. The conductive layers are separated by a dielectric material. Multiple layers of conductive material are also disposed elsewhere on the substrate to provide pads for external connection to the transistor. The pads are connected to the transistor by the conductive layers and the interlayer connections therebetween.

The pad, the conductive layers and and the interlayer connections therebetween act as an antenna and attract plasma current during fabrication. The plasma currents tunnel through the weakly bonded silicon dioxide layer into the silicon substrate. This damages the transistor, impedes its operation, and shortens its useful life.

Conventional transistor designs afford limited control over this problem. The prior approach to the problem has been to test for this tunnel-through with a "Hot Carder Injection" (HCI) test. The HCI test involves an application of a ground connection to the source terminal and the substrate of a transistor while applying a voltage to the gate and drain terminals. If the current through the device drops below a predetermined threshold, failure of the device is indicated.

Unfortunately, the conventional transistor design does not accurately simulate actual processing conditions. Accordingly, the test does not predict failure of certain transistors with a high degree of certainty. In addition, the conventional transistor design only allows to test one device at a time. Thus, the process of testing is time consuming and also requires a lot of die.

Hence, there is a need in the art for a method for improving the reliability of CMOS transistors. Specifically, there is a need in the art for a system and technique for reducing the deleterious effects associated with plasma tunneling in the fabrication of transistors.

SUMMARY OF THE INVENTION

The need in the art is addressed by the present invention which provides an improved transistor design and methods of construction and testing for same. The novel transistor includes a substrate, at least one source disposed on the substrate; at least one drain disposed on the substrate; and at least one gate disposed on the substrate between the source and the drain. The gate has a first layer of at least partially conductive material of area $A_g$ connected to a pad of area $A_p$. In accordance with the present teachings, the pad and gate are designed so that the the area of the pad $A_p$ to the area of the gate $A_g$ is such that the antenna ratio R therebetween is a predetermined number. In a particular implementation, the area $A_p$ includes the areas of plural conductive layers which connect the gate to the pad. In practice, the ratio R would be chosen to be a minimum so that deleterious plasma currents would not be attracted to the gate area.

In a particular implementation, the transistor includes plural gates each having a layer of at least partially conductive material of area $A_{gn}$, where n is any integer between 1 and N and where N is the total number of gates. In this case, the plural gates are interconnected so that the ratio R is a predetermined number equal to $A_p/A_{gtotal}$, where $A_{gtotal}$ is the sum of the areas $A_{gn}$ and n is any integer between 1 and N.

The novel transistor design method includes the steps of providing a transistor with multiple common gate areas; connecting each gate area to a pad; and adjusting the ratio of the area of the pad to the total of the gate areas to provide a predetermined ratio. The ratio may be adjusted by adjusting the size of the gate, in a single gate implementation, or by adjusting the number of gates in a multiple gate configuration.

The novel method for testing multiple gate transistors includes the steps of connecting a first terminal of each of said transistors to ground; interconnecting a second terminal of each transistor; and selectively applying a first source of supply potential to a third terminal of a selected transistor.

BRIEF DESCRIPTION OF THE DRAWINGS

FIG. 1 is an illustrative side view of a die such as that used to fabricate transistors in accordance with conventional teachings.

FIG. 2 is a side view of the die of FIG. 1 with portions of the silicon-dioxide layer thereof etched away to expose the silicon substrate and the doped junctions thereof.

FIG. 3 is a side view of the die of FIG. 2 with a metallization pattern applied to the source, gate and drain terminals thereof.

FIG. 4 is a topological view of the transistor die of FIG. 3.

DESCRIPTION OF THE INVENTION

Figure 5:
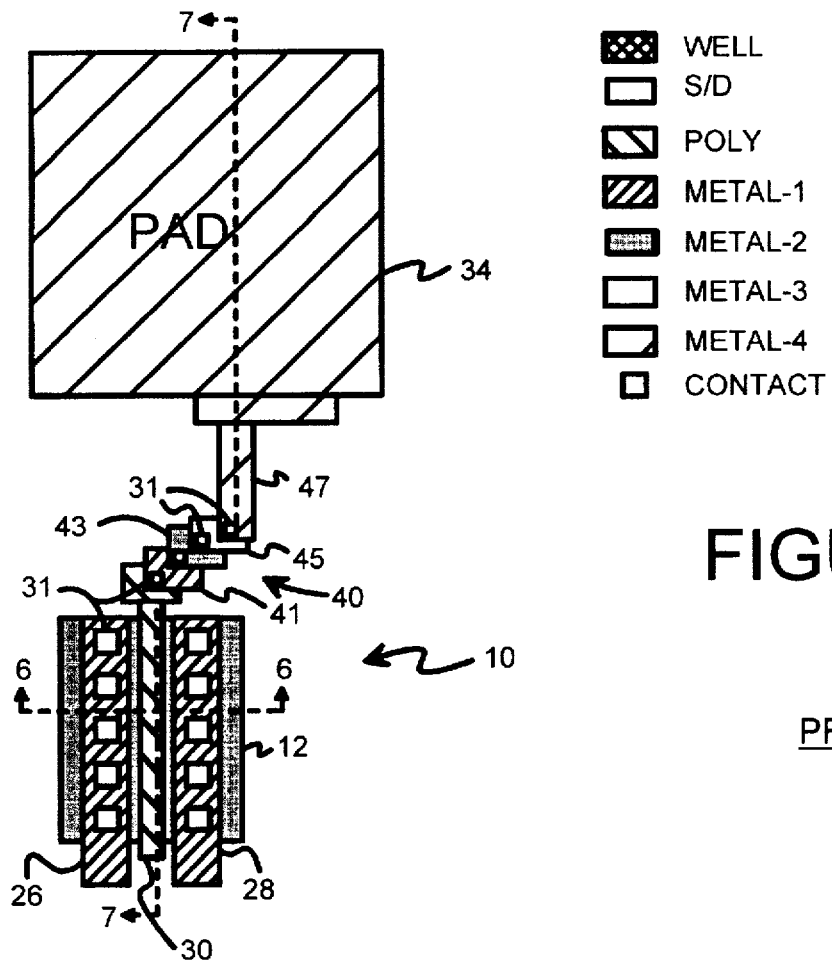
FIG. 5 is a topological multilayer view of the transistor die of FIG. 3 shown in greater detail.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

FIGS. 1, 2 and 3 are illustrative side views of a die such as that used to fabricate transistors in accordance with conventional teachings. The die 10 includes a substrate (typically silicon) on which a layer of material (e.g., silicon-dioxide) 14 is thermally grown. As illustrated in FIG. 2, the silicon-dioxide layer 14 is selectively removed to create areas 18 and 20 of exposed substrate. One currently favored technique for removing the silicon dioxide layer is to etch the layer 14 with a plasma current. As discussed herein, the plasma current often collects on the gate terminal and tunnels through the silicon-dioxide layer 14. This impairs the operation of the device 10 and limits its life.

The exposed areas 18 and 20 are bombarded with ions to implant impurities and thereby create junctions 22 and 24, respectively. Next, as illustrated in FIG. 3, a metalization pattern is laid down on the exposed areas 18 and 20 as well as the area therebetween to create a source contact 26, a drain contact 28 and gate finger 30 (typically constructed of polysilicon or other suitable material).

FIG. 4 is a top view of the die 10. As illustrated in FIG. 4, the source, gate and drain contacts 26, 30, and 28, respectively, are connected to pads 32, 34 and 36, respectively, by multilayer stacks of conductive material 38, 40 and 42, respectively.

Figure 6:
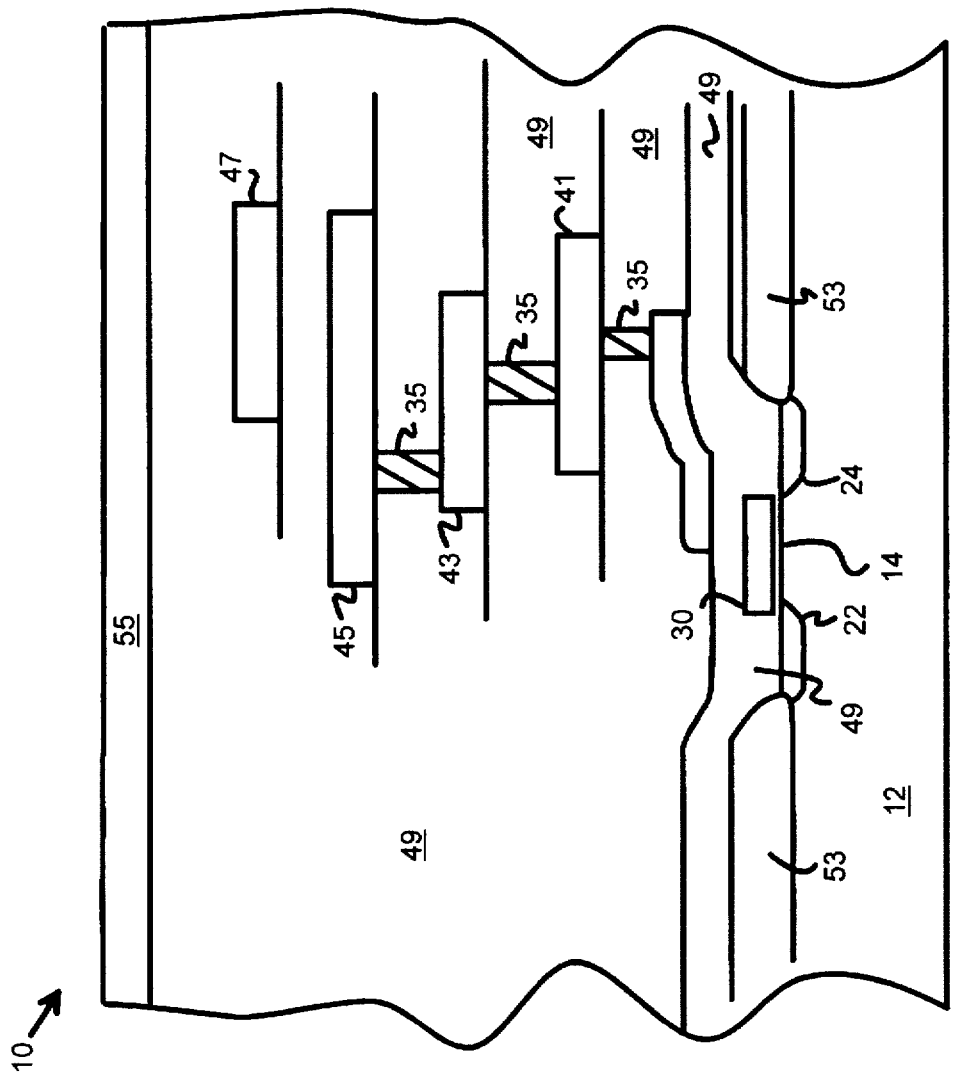
FIG. 6 is a sectional front view of the multilayer die structure of FIG. 5.
Figure 7:
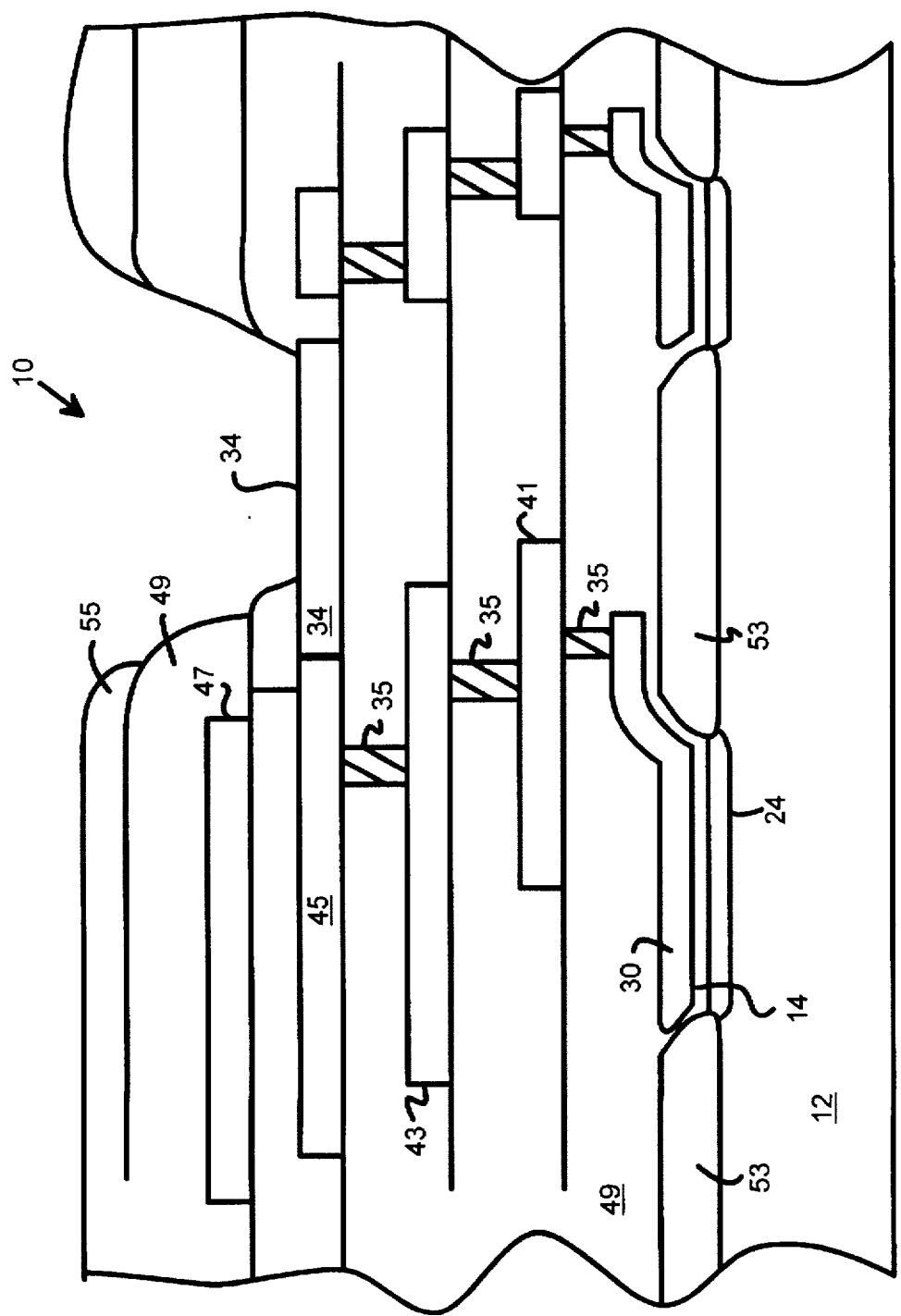
FIG. 7 is a sectional side view of the multilayer die structure of FIG. 5.

FIG. 5 is a topological multilayer view of the transistor die of FIG. 3 shown in greater detail. A gate finger 30 is shown on the source/drain diffusion region 12. Interlayer contacts 31 are provided on both sides of the gate finger 30. The gate 30 is connected to the pad 34 by an arrangement of conductive layers 40. The arrangement 40 comprises first, second, third and fourth layers of metallization 41, 43, 45 and 47, respectively. The first, second, third and fourth layers are interconnected at the interlayer contacts 31 by conductive plugs 35 (not shown). The conductive plugs 35 may be constructed of tungsten or other suitable material. As illustrated in FIGS. 6 and 7 below, the plugs 35 extend vertically through dielectric layers into the paper. The pad 34 is connected to the fourth conductive layer 47.

FIG. 6 is a sectional front view of the multilayer die structure of FIG. 5.

FIG. 7 is a sectional side view of the multilayer die structure of FIG. 5.

In FIGS. 6 and 7, the gate 30 is shown over the gate oxide layer 14 between the doped junctions 22 and 24 between insulating field oxide layers 53. An interlayer plug 35 connects the gate finger 30 to the first layer of metallization 41. As mentioned above, the multiple conductive layers 41, 43, 45 and 47 are interconnected by plugs 35 to complete the structure. The transistor die structure 10 is topped by the dielectric oxide layer 49 and a nitride layer 55 for scratch and moisture protection.

As best illustrated in FIG. 7, the pad 34 is in electrical contact with the fourth conductive layer 47.

It will be apparent to one skilled in the art that the pad 34, the plugs 35 and the multiple conductive layers 41, 43, 45 and 47 create an antenna structure. As discussed above, this antenna structure attracts plasma current which collects charge at the gate finger 30. If sufficiently high, this charge may tunnel through the gate oxide 14 into the silicon substrate 12 and impair the performance of the structure.

The present invention provides a structure which allows for an accurate testing of transistors constructed with this design to provide accurate data which may be used in the optimal construction of high performance devices within safe specifications.

The extent to which the plasma current collects on the gate terminal 30 is determined by the antenna ratio R of the device. The antenna ratio R at the level of the pad is given by the relation:

$$R = A_p/A_g \qquad [1]$$

where $A_p$ is the area of the gate pad 34 and the multiple layers of conductive material 40 and $A_g$ is the area of the gate 30.

In accordance with the method of the present invention, the size of the gate area is increased to a maximum within the design rules of the transistor. This is effected by either increasing the size of the silicon-dioxide layer of gate area or by adding additional gate fingers as depicted in FIG. 8.

Figure 8:
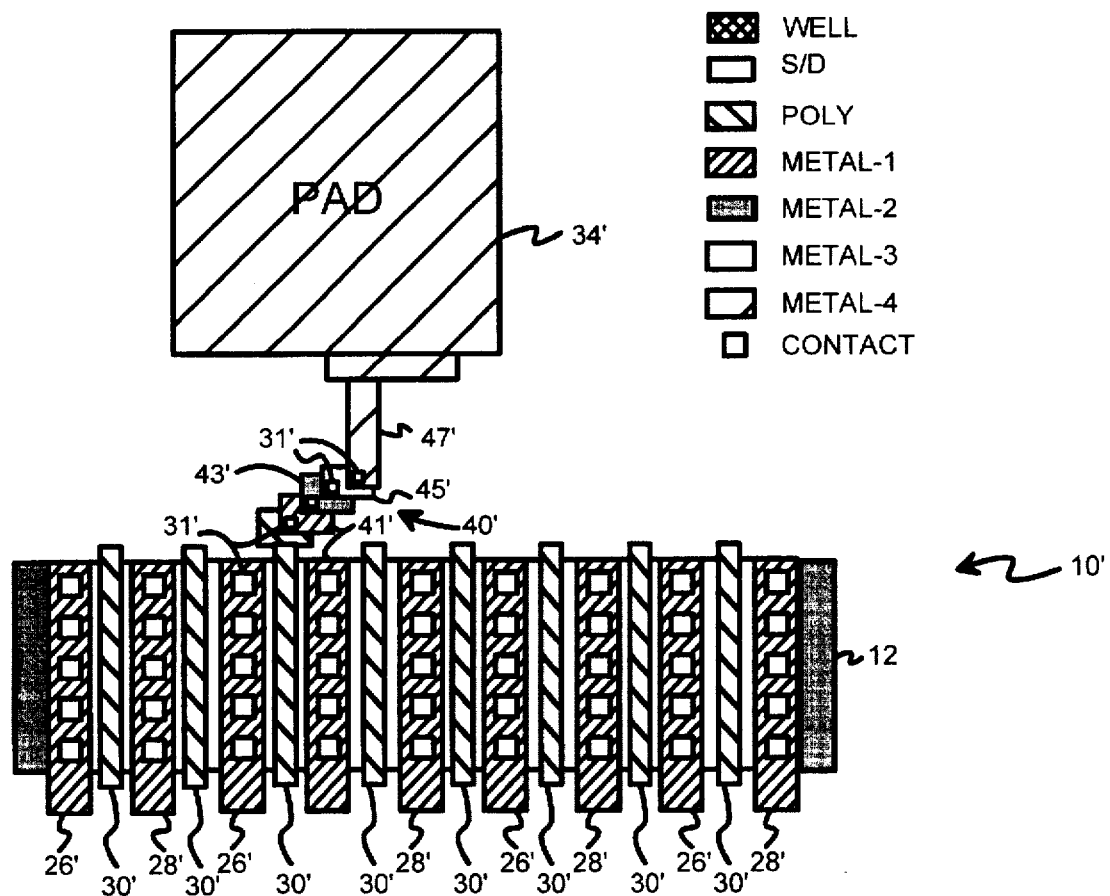
FIG. 8 is a simplified topological view of a transistor structure constructed in accordance with the teachings of the present invention.

FIG. 8 is a simplified topological view of a transistor structure constructed in accordance with the teachings of the present invention. As illustrated in FIG. 8, the transistor 10' includes a substrate 12' on which a plurality of source and drain terminals 26' and 28' are disposed in a conventional manner. Between the plural source and drain terminals 26' and 28', respectively, plural gate fingers 30' are disposed. The gate fingers 30' may be interconnected as shown in FIG. 8 or separate to provide a plurality of devices. In the illustrative embodiment, the gate fingers 30' are interconnected with a strip of doped polysilicon. This configuration allows for use of a novel testing method in accordance with the present teachings.

Figure 9:
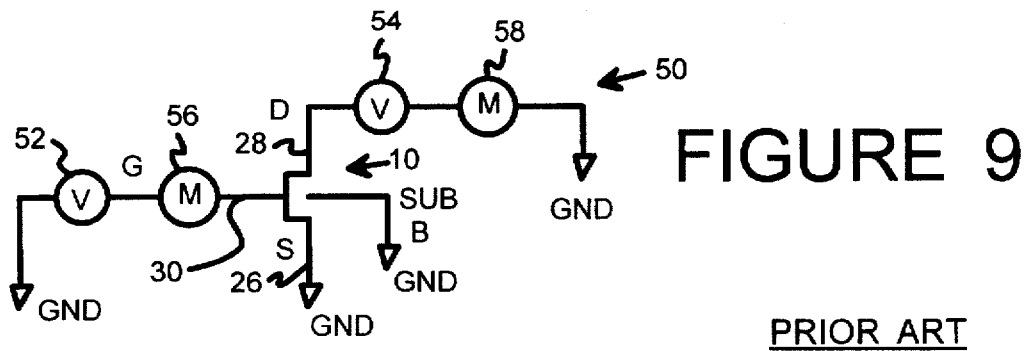
FIG. 9 is a schematic diagram of a conventional CMOS transistor test setup.

FIG. 9 is a schematic diagram of a conventional hot carrier injection test set up for a transistor. The arrangement 50 includes first and second voltage sources 52 and 54 connected to the gate finger 30 and drain terminal 28 respectively. Test instruments such as ammeters 56 and 58 or voltmeters (not shown) are connected to the gate and drain terminals 30 and 28, respectively. The source terminal 26 is tied to ground. However, this arrangement permits testing of a single transistor at one time.

The novel testing method of the present invention, however, permits testing of multiple transistors with minimal reconnect overhead per transistor. The novel test arrangement 50' of the present invention is shown in FIG. 10.

Figure 10:
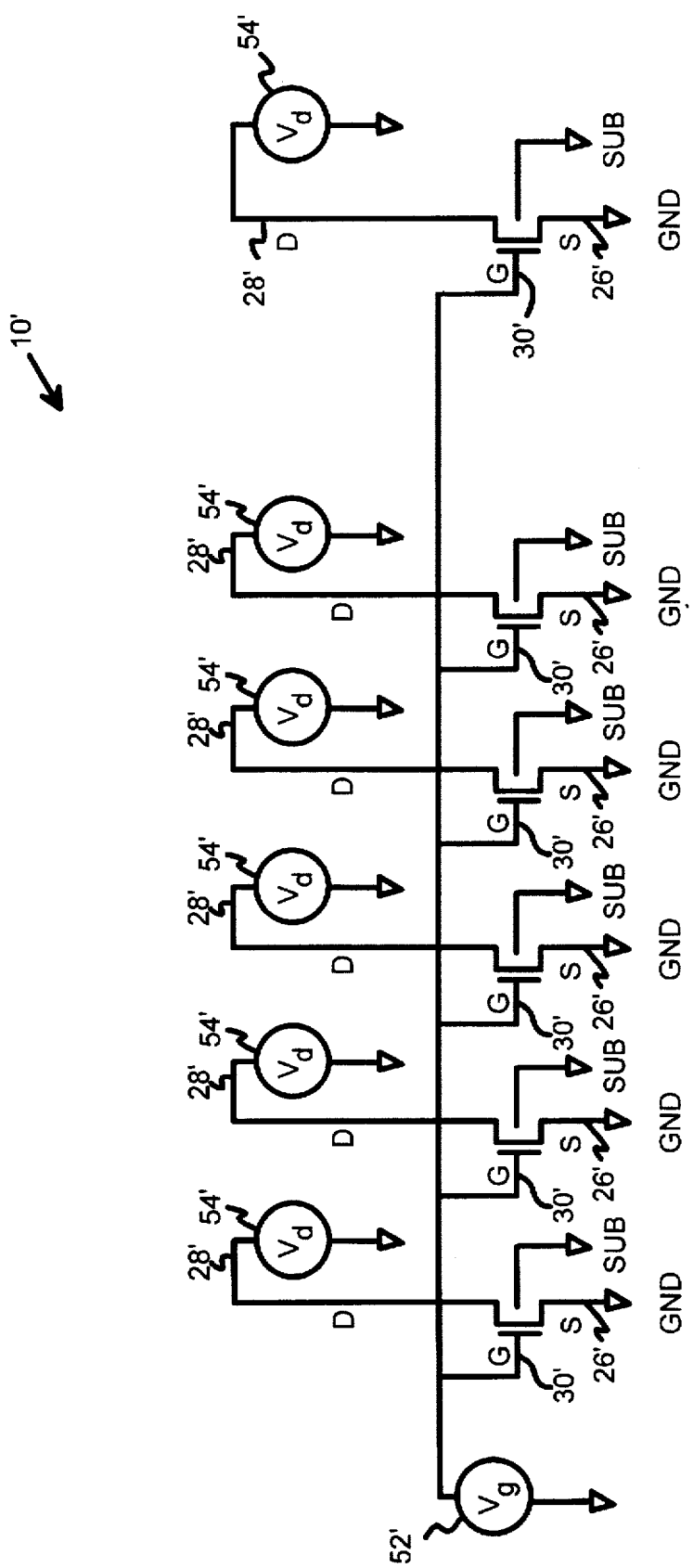
FIG. 10 is a schematic diagram of a test set up in accordance with the teachings of the present invention.

FIG. 10 is a schematic diagram of a test set up in accordance with the teachings of the present invention. The arrangement 50' includes a multiple gate transistor 10' such as that shown in FIG. 8. The source terminals 26' are grounded or tied common and grounded. The common gate fingers 30' are connected to a source of supply voltage 52'. A test instrument 56' (not shown) is connected to the common gate finger 30'. Next, each transistor may be selectively tested by applying a voltage (54') to its drain terminal. In the alternative, each transistor may be tested by applying separate equal or unequal voltages to the corresponding drain terminal. In this configuration, the (B terminal) is common and grounded as well. The test simulates the worst case DC operating working condition.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A transistor structure comprising:

a substrate;

at least one source disposed on the substrate;

at least one drain disposed on the substrate; and at least one gate disposed on the substrate between the source and the drain, the gate having a first layer of at least partially conductive material of area $A_g$ connected to a pad of area $A_p$ wherein the ratio R of $A_p$ to $A_g$ is equal to a predetermined number, the predetermined number having been chosen to be a minimum required to deter attraction of plasma current to the first layer of at least partially conductive material thereby deterring plasma current induced damage in the transistor structure.

2. The structure of claim 1 wherein the transistor includes plural gates each having a layer of at least partially conductive material of area $A_{gn}$ where n is any integer between 1 and N and where N is the total number of gates.

3. The structure of claim 2 wherein the ratio R is a predetermined number equal to $A_p/A_g$total, where $A_g$total is the sum of areas $A_{gn}$ and n is any integer between 1 and N.

4. The structure of claim 3 wherein the plural gates are interconnected.

5. The structure of claim 1 including plural layers of conductive material connected between the gate and the pad.

6. The structure of claim 5 wherein the area $A_p$ includes the areas of the conductive layers.

7. A method for designing a transistor including the steps of:

providing a transistor with multiple common gate areas;

connecting each gate area to a pad; and adjusting the ratio of the area of the pad to the total of the gate areas to provide a predetermined ratio, the predetermined ratio having been chosen, at least in part to be a minimum required to deter attraction of plasma current to the gate during fabrication.

8. The method of claim 7 wherein the step of adjusting the ratio of the area of the pad to the total of the gate areas includes the step of adjusting the size of a gate.

9. The method of claim 7 wherein the step of adjusting the ratio of the area of the pad to the total of the gate areas includes the step of adjusting the number of gates.

* * * * *